United States Patent
Tu

(10) Patent No.: US 11,984,153 B2
(45) Date of Patent: May 14, 2024

(54) MEMORY DEVICE

(71) Applicant: Winbond Electronics Corp., Taichung (TW)

(72) Inventor: Ying-Te Tu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 111 days.

(21) Appl. No.: 17/855,743

(22) Filed: Jun. 30, 2022

(65) Prior Publication Data

US 2024/0005979 A1    Jan. 4, 2024

(51) Int. Cl.
| | |
|---|---|
| *G11C 11/40* | (2006.01) |
| *G11C 11/408* | (2006.01) |
| *G11C 11/4091* | (2006.01) |
| *G11C 11/4094* | (2006.01) |

(52) U.S. Cl.
CPC ...... *G11C 11/4091* (2013.01); *G11C 11/4085* (2013.01); *G11C 11/4094* (2013.01)

(58) Field of Classification Search
CPC ............ G11C 11/4091; G11C 11/4085; G11C 11/4094
See application file for complete search history.

(56) References Cited

U.S. PATENT DOCUMENTS

| | | | |
|---|---|---|---|
| 7,474,550 B2* | 1/2009 | Fujisawa | H10B 12/48 365/230.03 |
| 7,586,804 B2* | 9/2009 | Hwang | G11C 11/4096 365/201 |
| 9,396,776 B2 | 7/2016 | Yang | |
| 9,570,150 B2 | 2/2017 | Kim | |
| 9,666,254 B1 | 5/2017 | Woo | |
| 9,978,435 B1 | 5/2018 | Park | |
| 2015/0364178 A1 | 12/2015 | Kim et al. | |
| 2022/0139447 A1 | 5/2022 | Shang et al. | |

FOREIGN PATENT DOCUMENTS

TW   202213714   4/2022

OTHER PUBLICATIONS

"Office Action of Taiwan Counterpart Application", issued on Sep. 6, 2023, p. 1-p. 7.

* cited by examiner

*Primary Examiner* — Vanthu T Nguyen
(74) *Attorney, Agent, or Firm* — JCIPRNET

(57) ABSTRACT

A memory device includes at least one memory cell block, a first edge block, a second edge block, multiple first sense amplifiers, and multiple second sense amplifiers. The first edge block is coupled to multiple first word lines, where at least one of the first word lines receives an enabled first word line signal. The second edge block is coupled to multiple second word lines, where at least one of the second word lines receives an enabled second word line signal. The first sense amplifiers are disposed between the first edge block and the memory cell block. The second sense amplifiers are disposed between the second edge block and the memory cell block.

7 Claims, 3 Drawing Sheets

MEMORY DEVICE

BACKGROUND

Technical Field

The disclosure relates to a memory device, and more particularly, to a memory device that may reduce a layout area and maintain load balance.

Description of Related Art

In the so-called dynamic random access memory with an open bit-line architecture, sense amplifiers are required to be disposed on two sides of each of memory cell blocks. Each of the memory cell blocks are divided into two equal numbers, and read and written through the sense amplifiers on the two sides.

Under this architecture, the two memory cell blocks at the edge of the conventional memory may not be read and written normally because only half of them are connected to the sense amplifiers. That is to say, there are two full-size memory cell blocks in the conventional memory that may not be used, resulting in a waste of layout area. Such a configuration may not be noticeable in a large-size memory. However, in a small-size memory (such as the memory used in artificial intelligence computing), a ratio of unusable memory cell blocks to a circuit size of the memory increases significantly, which will greatly affect the manufacturing cost.

SUMMARY

The disclosure provides a memory device, which effectively reduces an area required for a circuit layout on the premise of maintaining load balance between two input ends of a sense amplifier.

The memory device of the disclosure includes at least one memory cell block, a first edge block, a second edge block, multiple first sense amplifiers, and multiple second sense amplifiers. The first edge block is coupled to multiple first word lines. At least one of the first word lines receives an enabled first word line signal. The second edge block is coupled to multiple second word lines. At least one of the second word lines receives an enabled second word line signal. The first sense amplifiers are disposed between the first edge block and the memory cell block, respectively coupled to multiple first bit lines of the memory cell block, and respectively coupled to multiple second bit lines of the first edge block. The second sense amplifiers are disposed between the second edge block and the memory cell block, respectively coupled to multiple third bit lines of the memory cell block, and respectively coupled to multiple fourth bit lines of the second edge block.

Based on the above, in the disclosure, the first edge block and the second edge block are respectively disposed on two sides of the memory cell block. In addition, some of the word lines in the first edge block and the second edge block are enabled to provide loads to the corresponding sense amplifiers, so that the loads between two input ends of the sense amplifiers may be balanced, which improves reaction rates of the sensing operations of the sense amplifiers.

DETAILED DESCRIPTION OF DISCLOSED EMBODIMENTS

Figure 1:
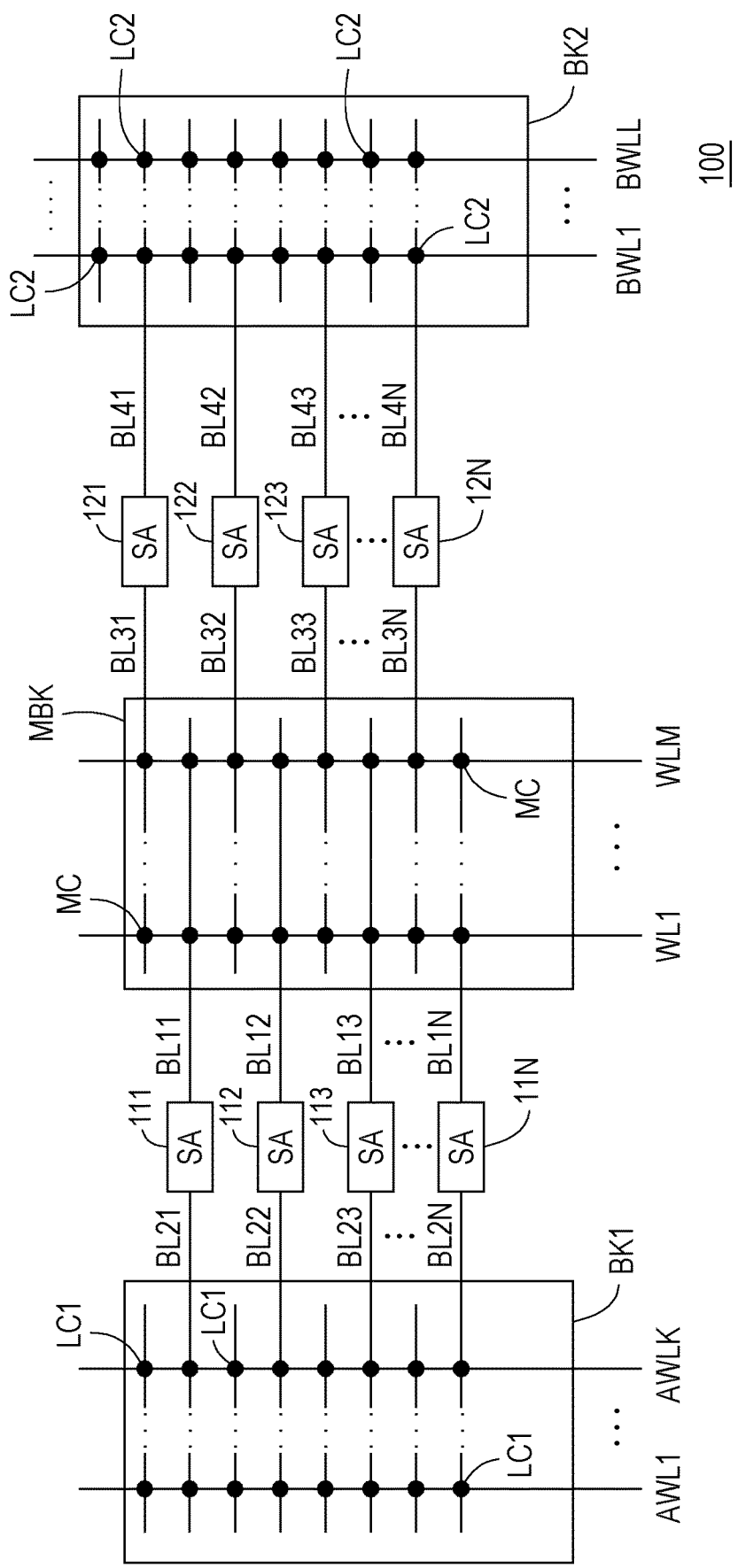
FIG. 1 is a schematic view of a memory device according to an embodiment of the disclosure.

Referring to FIG. 1, FIG. 1 is a schematic view of a memory device according to an embodiment of the disclosure. A memory device 100 includes a memory cell block MBK, edge blocks BK1 and BK2, and sense amplifiers (SA) 111 to 11N and 121 to 12N. In this embodiment, the edge blocks BK1 and BK2 may be respectively disposed on two different sides of the memory cell block MBK. The edge block BK1 is coupled to multiple word lines AWL1 to AWLK. At least one of the word lines AWL1 to AWLK receives an enabled word line signal. The edge block BK2 is coupled to multiple word lines BWL1 to BWLL. At least one of the word lines BWL1 to BWLL also receives the enabled word line signal.

The sense amplifiers (SA) 111 to 11N are coupled between the memory cell block MBK and the edge block BK1. First input ends of the sense amplifiers (SA) 111 to 11N are respectively coupled to multiple bit lines BL11 to BL1N of the memory cell block MBK. Second input ends of the sense amplifiers (SA) 111 to 11N are respectively coupled to multiple bit lines BL21 to BL2N of the memory cell block MBK.

The sense amplifiers (SA) 121 to 12N are coupled between the memory cell block MBK and the edge block BK2. First input ends of the sense amplifiers (SA) 121 to 12N are respectively coupled to multiple bit lines BL31 to BL3N of the memory cell block MBK. Second input ends of the sense amplifiers (SA) 121 to 12N are respectively coupled to multiple bit lines BL41 to BL4N of the memory cell block MBK. The bit lines BL11 to BL1N and the bit lines BL31 to BL3N of the memory cell block MBK are different bit lines. The bit lines BL11 to BL1N are, for example, the odd-numbered bit lines in the memory cell block MBK, while the bit lines BL31 to BL3N are, for example, the even-numbered bit lines in the memory cell block MBK.

Note that in this embodiment, the number of word lines AWL1 to AWLK in the edge block BK1 is less than the total number of word lines WL1 to WLM in the memory cell block MBK. The number of word lines BWL1 to BWLL in the edge block BK2 is also less than the total number of word lines WL1 to WLM in the memory cell block MBK. In addition, the number of word lines AWL1 to AWLK in the edge block BK1 and the number of word lines BWL1 to BWLL in the edge block BK2 may be the same or different.

Note that in this embodiment, the edge block BK1 is coupled to the word lines AWL1 to AWLK, and the number of received enabled word line signals may be determined according to a load on the first input ends of the corresponding sense amplifiers (SA) 111 to 11N. In this embodiment, the edge block BK1 has multiple load elements LC1 arranged in an array. Each of the load elements LC1 is coupled to each of the corresponding word lines AWL1 to AWLK and each of the corresponding bit lines BL21 to BL2N. The load element LC1 may provide a capacitive load, and provide the capacitive load to the corresponding bit line when the corresponding word line receives the enabled word line signal. Therefore, in this embodiment, by controlling the number of word lines AWL1 to AWLK receiving the enabled word line signal, a purpose of adjusting the load on each of the bit lines BL21 to BL2N may be achieved.

Similarly, in this embodiment, the edge block BK2 is coupled to the word lines BWL1 to BWLL, and the number of received enabled word line signals may be determined according to a load on the first input ends of the corresponding sense amplifiers (SA) 121 to 12N. In this embodiment, the edge block BK2 has multiple load elements LC2 arranged in an array. Each of the load elements LC2 is coupled to each of the corresponding word lines BWL1 to BWLL and each of the corresponding bit lines BL41 to BL4N. The load element LC2 may provide a capacitive load, and provide the capacitive load to the corresponding bit line when the corresponding word line receives the enabled word line signal. Therefore, in this embodiment, by controlling the number of word lines BWL1 to BWLL receiving the enabled word line signal, a purpose of adjusting the load on each of the bit lines BL41 to BL4N may be achieved.

Here, by adjusting the number of word lines AWL1 to AWLK and BWL1 to BWLL receiving the enabled word line signal, balance between loads on the two input ends of each of the sense amplifiers (SA) 111 to 11N and the sense amplifiers (SA) 121 to 12N may be made to maintain accuracy of sensing operations of the sense amplifiers (SA) 111 to 11N and the sense amplifiers (SA) 121 to 12N. It is worth mentioning that in this embodiment of the disclosure, by adjusting the number of word lines AWL1 to AWLK and BWL1 to BWLL receiving the enabled word line signal, a difference between the loads between the two input ends of each of the sense amplifiers (SA) 111 to 11N and the sense amplifiers (SA) 121 to 12N is less than a predetermined threshold value (or the loads between the two input ends are equal), so as to maintain the degree of balance of the loads thereof.

Incidentally, the load elements LC1 and LC2 may be a memory cell, a capacitor, or other electronic elements that may provide the capacitive loads, and there is no specific limitation. In addition, the word lines AWL1 to AWLK and BWL1 to BWLL that do not receive the enabled word line signal may receive a disabled word line signal.

In addition, the memory cell block MBK includes multiple memory cells MC. Each of the memory cells MC is coupled to each of the corresponding bit lines BL11 to BL1N and BL31 to BL3N, and each of the corresponding word lines WL1 to WLM. In this embodiment, the memory cells MC may be dynamic random access memory cells or other types of memory cells, and the memory device 100 may be a dynamic random access memory device with an open bit-line architecture.

The sense amplifiers (SA) 111 to 11N and the sense amplifiers (SA) 121 to 12N in this embodiment may be implemented by using any sense amplifier circuits known to those skilled in the art, and there is no certain limitation.

Based on the disposed edge blocks BK1 and BK2 in this embodiment, there are only a small number of word lines. Therefore, a layout area required for each of the edge blocks BK1 and BK2 may be smaller than a layout area of the complete memory cell block MBK. Therefore, on the premise of maintaining load balance of the sense amplifiers (SA) 111 to 11N and the sense amplifiers (SA) 121 to 12N, a circuit layout area required for the memory device 100 in this embodiment may be effectively reduced, thereby reducing the cost of the circuit.

Figure 2:
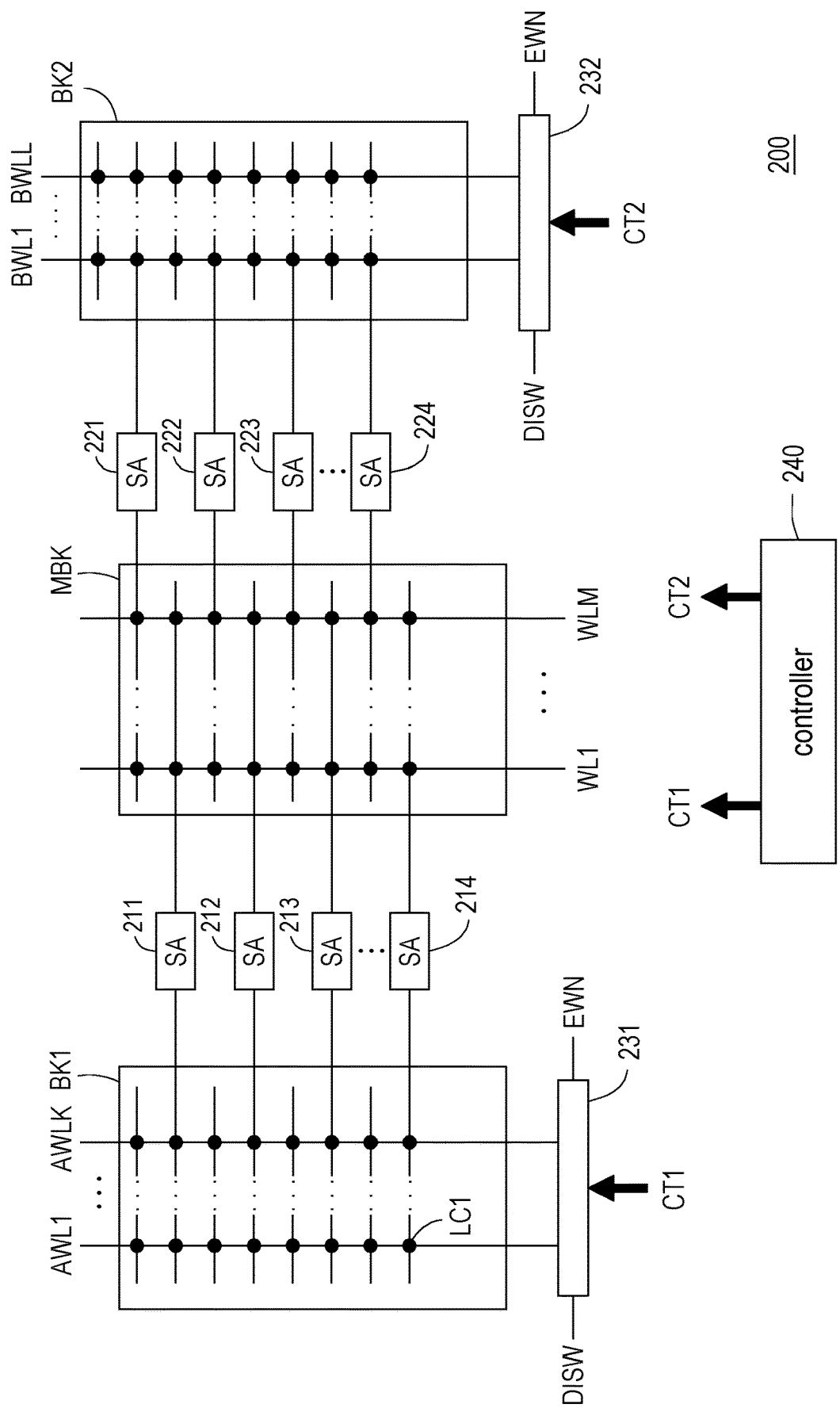
FIG. 2 is a schematic view of a memory device according to another embodiment of the disclosure.

Next, referring to FIG. 2, FIG. 2 is a schematic view of a memory device according to another embodiment of the disclosure. A memory device 200 includes the memory cell block MBK, the edge blocks BK1 and BK2, sense amplifiers (SA) 211 to 214 and 221 to 224, and a controller 240. In this embodiment, a coupling relationship among the memory cell block MBK, the edge blocks BK1 and BK2, and the sense amplifiers (SA) 211 to 214 and 221 to 224 is the same as that in the foregoing embodiment. Therefore, the same details will not be repeated in the following. Different from the foregoing embodiment, the controller 240 is disposed in the memory device 200. The controller 240 is coupled to the edge blocks BK1 and BK2. The controller 240 is configured to generate control signals CT1 and CT2, and provide the control signals CT1 and CT2 to the edge blocks BK1 and BK2, respectively, so as to control the number of word lines AWL1 to AWLK and BWL1 to BWLL receiving the enabled word line signal on the edge blocks BK1 and BK2.

In detail, the word lines AWL1 to AWLK may be coupled to a switch circuit 231, and the word lines BWL1 to BWLL may be coupled to a switch circuit 232. The switch circuits 231 and 232 also receive the control signals CT1 and CT2, respectively. The switch circuit 231 may enable a first portion of the word lines AWL1 to AWLK to receive an enable voltage EWN and a second portion of the word lines AWL1 to AWLK to receive a disable voltage DISW according to the control signal CT1. In this way, a load on an input end of the sense amplifiers (SA) 211 to 214 is adjusted. The switch circuit 232 may enable a first portion of the word lines BWL1 to BWLL to receive the enable voltage EWN and a second portion of the word lines BWL1 to BWLL to receive the disable voltage DISW according to the control signal CT2. In this way, a load on an input end of the sense amplifiers (SA) 221 to 224 is adjusted.

In this embodiment, the controller 240 may be not required to perform actual detection operations on the loads on the input ends of the sense amplifiers (SA) 211 to 214 and 221 to 224, but adjusts the number of correspondingly coupled word lines AWL1 to AWLK and BWL1 to BWLL receiving enabled word lines according to reaction rates of the sensing operations of the sense amplifiers (SA) 211 to 214 and 221 to 224.

In another embodiment, the controller 240 may also detect the load on the input ends of the sense amplifiers (SA) 211 to 214 coupled to the memory cell block MBK, and generate the control signal CT1 according to a detection result. In addition, the controller 240 may detect the load on the input ends of the sense amplifiers (SA) 221 to 224 coupled to the memory cell block MBK, and generate the control signal CT2 according to the detection result. Regarding the detection of the load, the controller 240 may apply a current (or a voltage) to an end point to be detected, and calculate the load by measuring the voltage (or the current) on the end point.

The switch circuit 231 includes multiple switches. Each of the switches is configured to select the corresponding word line (one of the word lines AWL1 to AWLK) to receive the enable voltage EWN or the disable voltage DISW according to a bit of the control signal CT1. The enable voltage EWN is equal to the enabled word line signal, and the disable voltage DISW is equal to the disabled word line signal. In this embodiment of the disclosure, the enable voltage EWN is greater than the disable voltage DISW. The switch circuit 232 may have the same circuit architecture and operation as the switch circuit 231. Therefore, the same details will not be repeated in the following.

It is worth mentioning that the controller 240 may be a circuit (e.g., a digital circuit) embedded in the memory device 200, and generates the control signals CT1 and CT2 in real time and performs a load balancing operation of the input ends of the sense amplifiers (SA) 211 to 224 during the operation of the memory device 200. In other embodiments, the controller 240 may also be an external circuit (e.g., an external test circuit) of the memory device 200. In such a case, the controller 240 may provide the control signals CT1 and CT2, so that the fixed number of the word lines AWL1 to AWLK and BWL1 to BWLL are tied to receive the enable voltage EWN.

Figure 3:
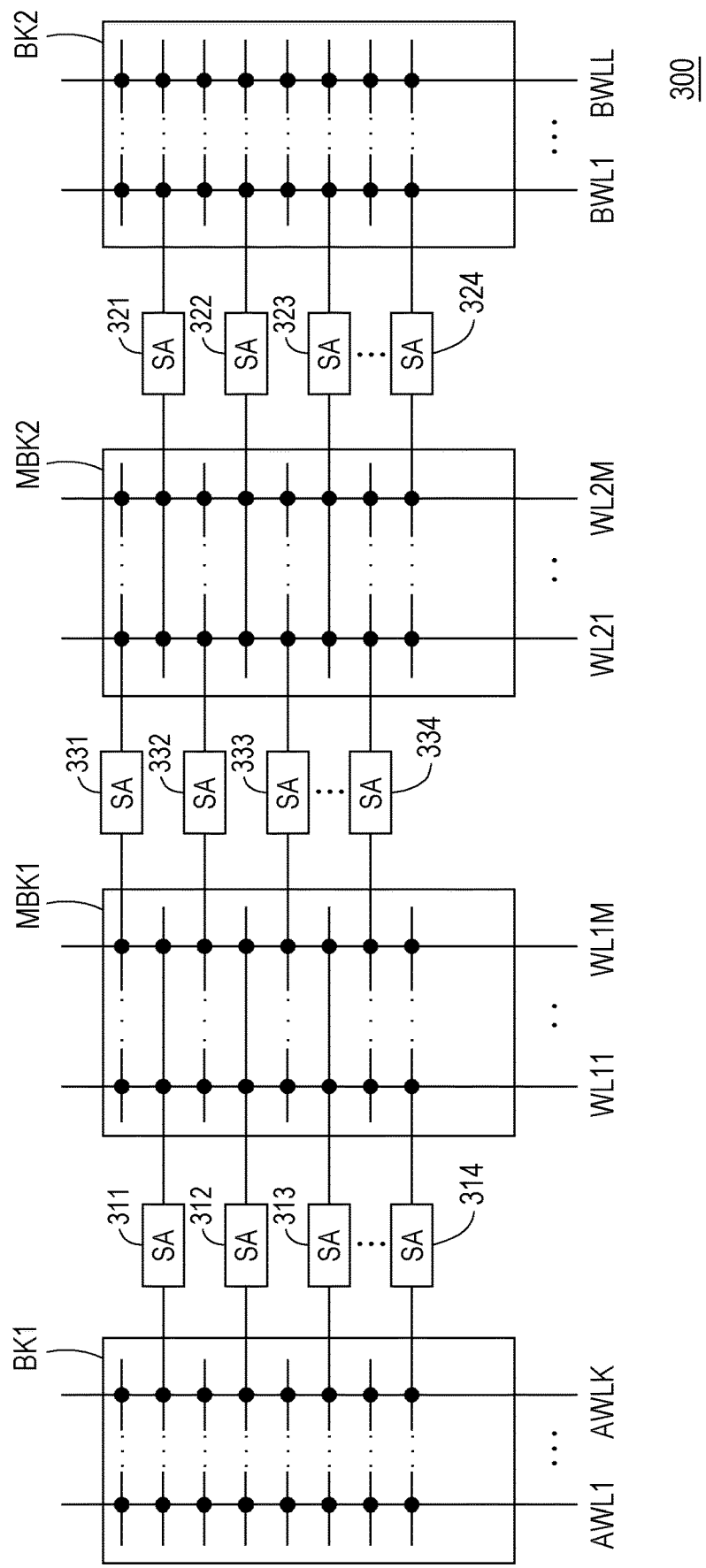
FIG. 3 is a schematic view of a memory device according to another embodiment of the disclosure.

Referring to FIG. 3, FIG. 3 is a schematic view of a memory device according to another embodiment of the disclosure. A memory device 300 includes memory cell blocks MBK1 and MBK2, the edge blocks BK1 and BK2, and sense amplifiers (SA) 311 to 334. Different from the foregoing embodiments, the memory device 300 in this embodiment has the memory cell blocks MBK1 and MBK2. The memory cell blocks MBK1 and MBK2 are sequentially coupled between the edge block BK1 and the edge block BK2. The memory cell blocks MBK1 and MBK2 are respectively coupled to word lines WL11 to WL1M and word lines WL21 to WL2M. The total number of word lines WL11 to WL1M may be equal to the total number of word lines WL21 to WL2M. In addition, the number of word lines AWL1 to AWLK coupled to the edge block BK1 and the number of word lines BWL1 to BWLL coupled to the edge block BK2 are both less than the total number of word lines WL11 to WL1M and the total number of word lines WL21 to WL2M. Taking the memory cell blocks MBK1 and MBK2 each having a memory capacity of 4 megabytes as an example, the memory device 300 may have a memory capacity of 8 megabytes.

In an example, each of the memory cell blocks MBK1 and MBK2 may be coupled to 512 word lines, and the edge blocks BK1 and BK2 may be coupled to only a few or dozens of word lines. That is, the layout area of each of the edge blocks BK1 and BK2 is much smaller than a layout area of each of the memory cell blocks MBK1 and MBK2.

In addition, in other examples, three or more memory cell blocks may be disposed between the edge blocks BK1 and BK2. The number of memory cell blocks is not limited.

Based on the above, in the memory device of the disclosure, the edge block is disposed in the memory device, and the load is provided to the input end of the adjacent sense amplifier through the edge block. Furthermore, the memory device of the disclosure adjusts the correspondingly provided load by adjusting the number of enabled bit lines on the edge block, so that the load between the two input ends of the sense amplifier may be balanced to improve the reaction rate of the sense amplifier.

What is claimed is:

1. A memory device, comprising:
   at least one memory cell block;
   a first edge block coupled to a plurality of first word lines, wherein at least one of the first word lines receives an enabled first word line signal;
   a second edge block coupled to a plurality of second word lines, wherein at least one of the second word lines receives an enabled second word line signal;
   a plurality of first sense amplifiers disposed between the first edge block and the at least one memory cell block, respectively coupled to a plurality of first bit lines of the at least one memory cell block, and respectively coupled to a plurality of second bit lines of the first edge block;
   a plurality of second sense amplifiers disposed between the second edge block and the at least one memory cell block, respectively coupled to a plurality of third bit lines of the at least one memory cell block, and respectively coupled to a plurality of fourth bit lines of the second edge block; and
   a controller coupled to the first edge block and the second edge block to control a first number of the first word lines receiving the enabled first word line signal and control a second number of the second word lines receiving the enabled second word line signal,
   wherein the controller adjusts the first number according to a load on a first input end of each of the first sense amplifiers or a reaction rate of each of the first sense amplifiers, and the controller adjusts the second number according to a load on a first input end of each of the second sense amplifiers or a reaction rate of each of the second sense amplifiers,
   wherein the first input end of each of the first sense amplifiers and the first input end of each of the second sense amplifiers are coupled to the at least one memory cell block.

2. The memory device according to claim 1, wherein the first input end of each of the first sense amplifiers is coupled to each of the first bit lines, a second input end of each of the first sense amplifiers is coupled to each of the second bit lines, and the first number of the first word lines receiving the enabled first word line signal is determined according to a load on the first input end of each of the first sense amplifiers.

3. The memory device according to claim 2, wherein the load on the first input end of each of the first sense amplifiers is equal to a load on the second input end of each of the first sense amplifiers.

4. The memory device according to claim 1, wherein the first input end of each of the second sense amplifiers is coupled to each of the third bit lines, a second input end of each of the second sense amplifiers is coupled to each of the fourth bit lines, and the second number of the second word lines receiving the enabled second word line signal is determined according to a load on the first input end of each of the second sense amplifiers.

5. The memory device according to claim 4, wherein a difference between the load on the first input end of each of the second sense amplifiers and a load on the second input end of each of the second sense amplifiers is less than a predetermined threshold value.

6. The memory device according to claim 1, wherein a total number of the first word lines is less than a total number of word lines of the at least one memory cell block, and a total number of the second word lines is less the total number of the word lines of the at least one memory block.

7. The memory device according to claim 1, wherein the first edge block further comprises a plurality of first load elements, each of the first load elements is coupled to each of the corresponding first word lines and each of the corresponding second bit lines, the second edge block further comprises a plurality of second load elements, and each of the second load elements is coupled to each of the corresponding second word lines and each of the corresponding fourth bit lines.

* * * * *